US011973200B2

(12) United States Patent
Dadheech et al.

(10) Patent No.: US 11,973,200 B2
(45) Date of Patent: Apr. 30, 2024

(54) REFERENCE ELECTRODE ASSEMBLY AND METHOD OF MANUFACTURING THE SAME (71) Applicant: GM GLOBAL TECHNOLOGY OPERATIONS LLC, Detroit, MI (US)

(72) Inventors: Gayatri V. Dadheech, Bloomfield Hills, MI (US); Mark W. Verbrugge, Troy, MI (US); Alok Warey, Novi, MI (US); Brian J. Koch, Berkley, MI (US); Jing Gao, Warren, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 662 days.

(21) Appl. No.: 17/112,031

(22) Filed: Dec. 4, 2020

(65) Prior Publication Data

US 2022/0181712 A1  Jun. 9, 2022

(51) Int. Cl.
*H01M 10/48* (2006.01)
*G01R 31/364* (2019.01)
*H01M 4/485* (2010.01)
*H01M 10/0525* (2010.01)
*H01M 4/38* (2006.01)
*H01M 4/587* (2010.01)

(52) U.S. Cl.
CPC .......... *H01M 10/48* (2013.01); *G01R 31/364* (2019.01); *H01M 4/485* (2013.01); *H01M 10/0525* (2013.01); *H01M 4/386* (2013.01); *H01M 4/587* (2013.01)

(58) Field of Classification Search
CPC .. H01M 10/48; H01M 4/485; H01M 10/0525; H01M 4/386; H01M 4/587; H01M 4/625; H01M 50/414; H01M 4/131; H01M 50/569; G01R 31/364; G01N 27/301
USPC .......................................... 429/90
See application file for complete search history.

(56) References Cited

U.S. PATENT DOCUMENTS 10,418,622 B2   9/2019  Koch et al.
10,439,256 B2  10/2019  Koch et al.
10,938,028 B2   3/2021  Yang et al.
(Continued)

FOREIGN PATENT DOCUMENTS

CN  104300128 A  1/2015
CN  107799844 A  3/2018
CN  109713381 A  5/2019
(Continued)

OTHER PUBLICATIONS

First Office Action for Chinese Patent Application No. 202110526601.6 issued on Jan. 12, 2024, with correspondence from China Patent Agent (H.K.) Ltd. summarizing Office Action; 13 pages.

*Primary Examiner* — Gary D Harris
(74) *Attorney, Agent, or Firm* — Harness, Dickey & Pierce, P.L.C.

(57) ABSTRACT

A reference electrode assembly for an electrochemical cell of a secondary lithium ion battery and methods of manufacturing the same. The reference electrode assembly includes a porous membrane having a major surface and a porous reference structure deposited on the major surface of the porous membrane. The porous reference structure includes a porous carbon layer and a porous reference electrode layer that at least partially overlaps the porous carbon layer on the major surface of the porous membrane.

20 Claims, 4 Drawing Sheets

(56) References Cited

U.S. PATENT DOCUMENTS

2013/0105308 A1\* 5/2013 Kirchev ............... G01N 27/301
427/58

FOREIGN PATENT DOCUMENTS

| CN | 111081968 A | 4/2020 |
|----|----|----|
| CN | 114594145 A | 6/2022 |
| DE | 102015102089 A1 | 8/2015 |
| DE | 102021111703 A1 | 6/2022 |
| JP | 2018060620 A | 4/2018 |
| KR | 20060095182 A | 8/2006 |

\* cited by examiner

REFERENCE ELECTRODE ASSEMBLY AND METHOD OF MANUFACTURING THE SAME

INTRODUCTION

The present invention relates to a reference electrode assembly and, more particularly, to a reference electrode assembly for performing electrochemical analysis on secondary lithium ion batteries.

A battery is a device that converts chemical energy into electrical energy by means of electrochemical reduction-oxidation (redox) reactions. In secondary or rechargeable batteries, these electrochemical reactions are reversible, which allows the batteries to undergo multiple charging and discharge cycles.

Secondary lithium batteries generally comprise one or more electrochemical cells that operate by reversibly passing lithium ions between a negative electrode and a positive electrode. The negative and positive electrodes are oftentimes disposed on opposite sides of a porous polymeric separator, and each of the negative and positive electrodes is typically carried on, or connected to, a metallic current collector. The negative and positive electrodes and the polymeric separator are infiltrated with an ionically conductive electrolyte that provides a medium for the conduction of lithium ions through the electrochemical cell between the negative and positive electrodes. In practice, an electrochemical potential is established between the negative and positive electrodes of the electrochemical cell by connecting their respective current collectors to one another via a controllable and interruptible external circuit. During discharge, the electrochemical potential established between the negative and positive electrodes drives spontaneous redox reactions within the electrochemical cell and the release of lithium ions and electrons at the negative electrode. The released lithium ions travel from the negative electrode to the positive electrode through the ionically conductive electrolyte, and the electrons travel from the negative electrode to the positive electrode via the external circuit, which generates an electric current. After the negative electrode has been partially or fully depleted of lithium, the electrochemical cell may be recharged by connecting the negative and positive electrodes to an external power source, which drives nonspontaneous redox reactions within the electrochemical cell and the release of the lithium ions and the electrons from the positive electrode.

The electrochemical potential between the negative and positive electrodes may be monitored during operation of the electrochemical cell (during charging and discharging), for example, by respectively connecting the current collectors of the negative and positive electrodes to a suitable meter. It also may be desirable to monitor the electrochemical potential of the negative and positive electrodes individually, for example, to determine the state of lithiation or state of charge of the electrodes. To accomplish this, a reference electrode may be positioned within the electrochemical cell, for example, at a location between the negative and positive electrodes. Reference electrodes are commonly used in electrochemical cells in laboratory environments. However, there exists a need in the art for a reference electrode assembly that can be incorporated into the electrochemical cells of commercial batteries.

SUMMARY

A reference electrode assembly for an electrochemical cell of a secondary lithium ion battery is disclosed. The reference electrode assembly may comprise a porous membrane having a first major surface and an opposite second major surface, and a porous reference structure disposed on the first major surface of the porous membrane. The porous reference structure may include a porous carbon layer deposited on the first major surface of the porous membrane, and a porous reference electrode layer deposited on the first major surface of the porous membrane. The carbon layer may be made of a carbon-based material. The porous reference electrode layer may include an electrochemically active reference electrode material. The porous reference electrode layer may at least partially overlap the porous carbon layer on the first major surface of the porous membrane.

The porous carbon layer may have a thickness in a range of 10 nanometers to 1 micrometer.

The carbon-based material of the porous carbon layer may comprise at least one of carbon particles, carbon fibers, carbon nanotubes, or graphene. The carbon-based material of the porous carbon layer may comprise, by weight, greater than 60% carbon.

The porous reference electrode layer may have a thickness in a range of 200 nanometers to 10 micrometers.

The electrochemically active reference electrode material of the reference electrode layer may comprise at least one metal oxide of lithium iron phosphate, lithium titanium oxide, or lithium nickel manganese cobalt oxide.

The porous membrane may be made of an ionically conductive polymeric material. The ionically conductive polymeric material may comprise at least one of polyethylene, polypropylene, polyamide, poly(tetrafluoroethylene), polyvinylidene fluoride, or poly(vinyl chloride).

The porous reference structure may further include a porous adhesion promoting layer deposited directly on the first major surface of the porous membrane. In such case, the porous carbon layer may be deposited on the first major surface of the porous membrane over the porous adhesion promoting layer. The porous adhesion promoting layer may include at least one metal of copper, nickel, silver, or gold. The porous adhesion promoting layer may be deposited on the first major surface of the porous membrane in the form of a single monolayer or multiple sequentially deposited monolayers. The porous adhesion promoting layer may have a thickness in a range of 2 nanometers to 100 micrometers.

The porous reference structure may further include a porous encapsulation layer overlying the porous carbon layer and the porous reference electrode layer on the first major surface of the porous membrane. In such case, the porous encapsulation layer may have a thickness in a range of 5 nanometers to 100 micrometers. The porous encapsulation layer may comprise at least one ceramic material of $Al_2O_3$, $SiO_2$, $ZrO_2$, or a zeolite.

The porous membrane and the porous reference structure may be infiltrated with a nonaqueous liquid electrolyte solution.

The reference electrode assembly may further comprise an electrical connector tab having a first end and an opposite second end. The first end of the electrical connector tab may be electrically coupled to the porous carbon layer. The second end of the electrical connector tab may extend beyond an outer periphery of the porous membrane. The porous carbon layer may provide an electrically conductive pathway for the transfer of electrons between the reference electrode layer and the first end of the electrical connector tab.

The porous carbon layer may be deposited on the first major surface of the porous membrane in the form of a predetermined circuit pattern that includes multiple discrete electrically conductive pathways. In such case, the porous reference electrode layer may be deposited on the first major surface of the porous membrane in the form of multiple discrete reference electrode regions, with each of the discrete electrically conductive pathways being electrically coupled to one of the discrete reference electrode regions of the porous reference electrode layer.

An electrochemical cell of a secondary lithium ion battery is disclosed. The electrochemical cell comprises a positive electrode layer electrically coupled to a positive electrode current collector, a negative electrode layer spaced apart from the positive electrode layer and electrically coupled to a negative electrode current collector, and a reference electrode assembly disposed between the positive electrode layer and the negative electrode layer. The reference electrode assembly may comprise a first porous membrane having a first major surface, a second porous membrane having a second major surface in facing opposition to the first major surface of the first porous substrate, and a porous reference structure sandwiched between the first major surface of the first porous membrane and the second major surface of the second porous membrane. The porous reference structure may include a porous carbon layer deposited on the first major surface of the first porous membrane, and a porous reference electrode layer deposited on the first major surface of the first porous membrane. The porous carbon layer may be made of a carbon-based material. The porous reference electrode layer may include an electrochemically active reference electrode material. The porous reference electrode layer may at least partially overlap the porous carbon layer on the first major surface of the first porous membrane.

The positive electrode layer may comprise at least one transition metal oxide that can undergo the reversible intercalation of lithium ions. The negative electrode layer may comprise at least one of graphite or silicon.

A method of manufacturing a reference electrode assembly for an electrochemical cell of a secondary lithium ion battery is disclosed. In such method, a porous polymeric substrate having a major surface is provided. A precursor solution is deposited on the major surface of the porous polymeric substrate. The precursor solution may include particles of a carbon-based material dispersed in a first solvent. The first solvent may be removed from the precursor solution to form a porous carbon layer on the major surface of the porous polymeric substrate. A slurry may be deposited on the major surface of the porous polymeric substrate such that the slurry at least partially overlaps the porous carbon layer. The slurry may include particles of an electrochemically active reference electrode material dispersed in a second solvent. The second solvent may be removed from the slurry to form a porous reference electrode layer on the major surface of the porous polymeric substrate.

The precursor solution may be deposited on the major surface of the porous polymeric substrate using an ink jet printing, aerosol printing, screen printing, or low velocity plasma jet printing process.

The method of manufacturing the reference electrode assembly may further comprise, prior to depositing the precursor solution on the major surface of the porous polymeric substrate, subjecting the major surface of the porous polymeric substrate to a plasma treatment.

The method may further comprise, prior to depositing the precursor solution on the major surface of the porous polymeric substrate, forming a porous adhesion promoting layer on the major surface of the porous polymeric substrate. The precursor solution may be deposited on the major surface of the porous polymeric substrate over the porous adhesion promoting layer. The porous adhesion promoting layer may be formed on the major surface of the porous polymeric substrate by dry sputtering or electrolytic deposition.

The method may further comprise forming a porous encapsulation layer over the porous carbon layer and the porous reference electrode layer on the major surface of the porous polymeric substrate. The porous encapsulation layer may be formed on the major surface of the porous polymeric substrate by an atomic layer deposition or dip coating process.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

BRIEF DESCRIPTION OF THE DRAWINGS

Illustrative embodiments will hereinafter be described in conjunction with the appended drawings, wherein like designations denote like elements, and wherein.

The present disclosure is susceptible to modifications and alternative forms, with representative embodiments shown by way of example in the drawings and described in detail below. Inventive aspects of this disclosure are not limited to the particular forms disclosed. Rather, the present disclosure is intended to cover modifications, equivalents, combinations, and alternatives falling within the scope of the disclosure as defined by the appended claims.

DETAILED DESCRIPTION

The presently disclosed reference electrode assembly includes a porous polymeric membrane having a porous reference structure deposited on a major surface thereof. The porous reference structure includes a porous carbon layer and a porous reference electrode layer that at least partially overlaps the porous carbon layer on the major surface of the porous polymeric membrane. The porous carbon layer can provide an electrically conductive pathway between the porous reference electrode layer and an electrical connector tab that extends beyond a periphery of the porous polymeric membrane so that the potential of the porous reference electrode layer may be used by an external device as reference in measuring the electrochemical potential of other components within an electrochemical cell. The porous carbon layer may be deposited on the major surface of the porous polymeric membrane using a continuous low-cost printing process, which may facilitate the industrial-scale manufacture of the reference electrode assembly.

The disclosed reference electrode assembly may be incorporated into an electrochemical cell of a secondary lithium ion battery to allow for an accurate measurement of the individual electrochemical potentials of the positive and negative electrode layers in the electrochemical cell in real-time during battery operation. Measurement of the overall cell voltage may be performed simultaneously and used in combination with the individual electrochemical potential measurements of the positive and negative electrode layers to accurately determine the state of charge (SOC) of the electrochemical cell. An accurate determination of the state of charge of the electrochemical cell can be used to identify certain optimum charging parameters that can be used to achieve fast charging rates without impairing the overall functionality and/or long-term cycle stability of the electrochemical cell. In addition, an accurate measurement of the electrochemical potential of the negative electrode in real-time may allow the charging process to be performed at the fastest charging rate and to be terminated before lithium plating occurs.

Figure 1:
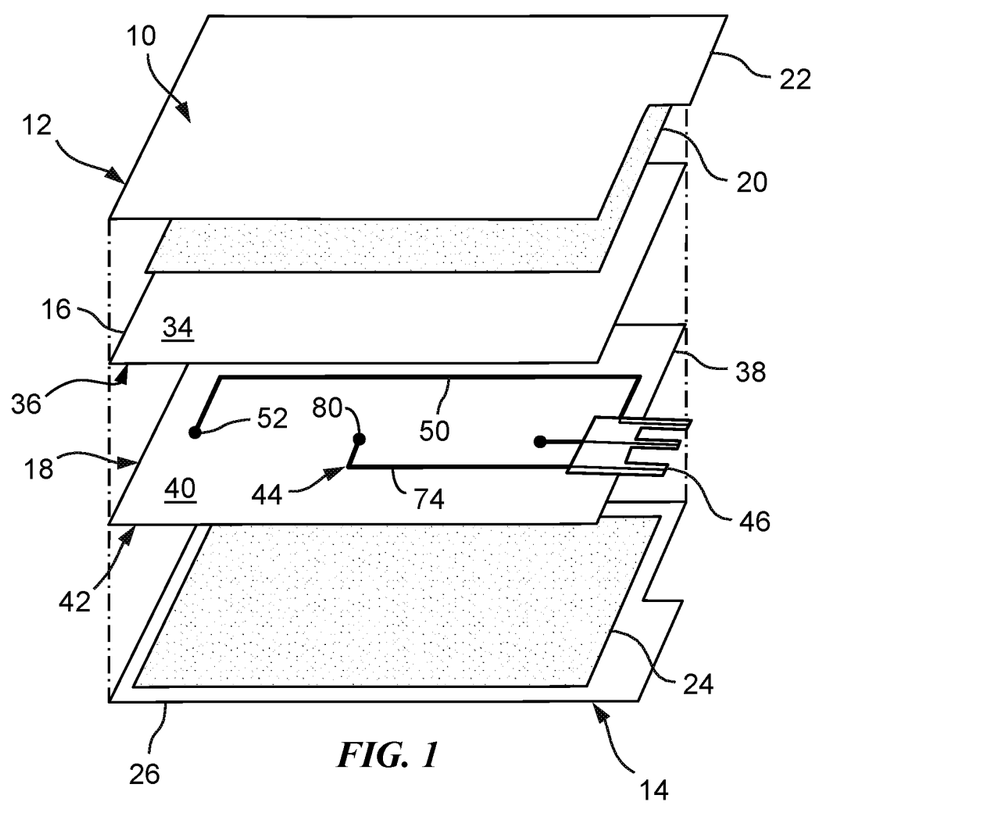
FIG. 1 is a schematic exploded perspective view of an electrochemical cell of a secondary lithium ion battery, the electrochemical cell including a reference electrode assembly disposed between a positive electrode and a negative electrode.
Figure 3:
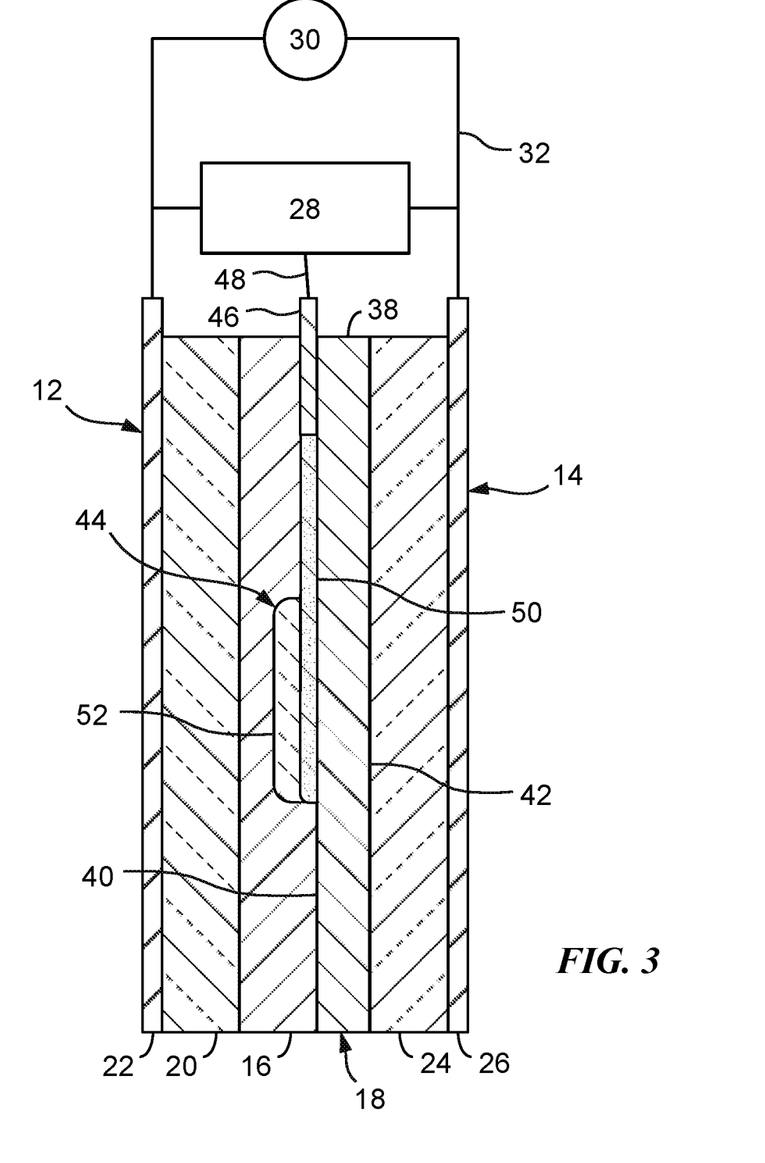
FIG. 3 is a schematic side cross-sectional view of the electrochemical cell of FIG. 1 coupled to a power source or load and a controller.

FIG. 1 depicts an exploded perspective view of an electrochemical cell 10 that may be combined with one or more additional electrochemical cells to form a secondary battery, such as a lithium ion or lithium metal battery. The electrochemical cell 10 includes a positive electrode 12, a negative electrode 14, a porous separator 16 that electrically isolates the positive and negative electrodes 12, 14 from each other, and a reference electrode assembly 18 disposed between and electrically isolated from the positive and negative electrodes 12, 14. The positive electrode 12 may include a positive electrode material layer 20 deposited on a major surface of a positive electrode current collector 22, and the negative electrode 14 may include a negative electrode material layer 24 deposited on a major surface of a negative electrode current collector 26. In assembly, the positive and negative electrode material layers 20, 24 and the reference electrode assembly 18 may be infiltrated with an electrolyte (not shown) that facilitates the free flow of ions between the positive and negative electrode material layers 20, 24 during operation of the electrochemical cell 10. As shown in FIG. 3, in practice, the positive and negative electrode current collectors 22, 26 may be electrically coupled to a controller 28 and to a power source or load 30 via an external circuit 32.

Figure 2:
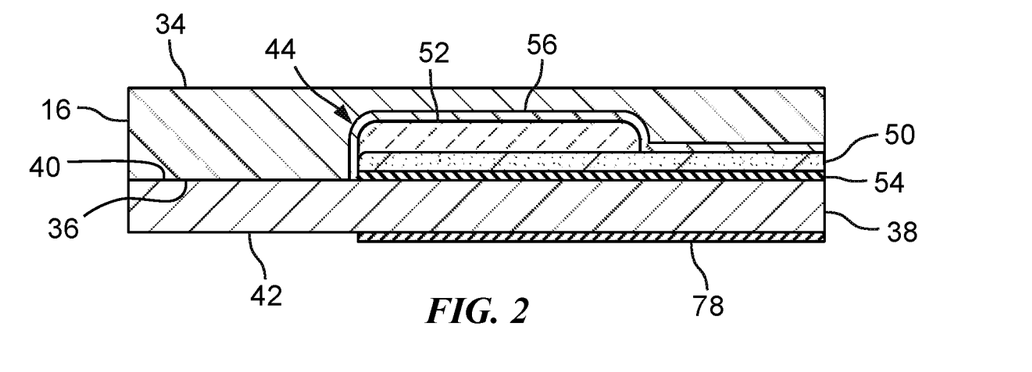
FIG. 2 is a schematic side cross-sectional view of a portion of the reference electrode assembly of FIG. 1.

Referring now to FIGS. 1, 2, and 3, the porous separator 16 is positioned between the positive electrode 12 and the reference electrode assembly 18. As such, the porous separator 16 has a first major surface 34 that faces toward the positive electrode 12 and an opposite second major surface 36 that faces toward the reference electrode assembly 18 and the negative electrode 14. The porous separator 16 exhibits an open microporous structure and may comprise an organic and/or inorganic materials that can physically separate and electrically insulate the positive and negative electrode material layers 20, 24 from each other while permitting the free flow of ions therebetween. In practice, the pores of the porous separator 16 may be wet and/or infiltrated with an electrolyte to provide the porous separator 16 with ion permeability. The porous separator 16 may comprise a non-woven material, e.g., a manufactured sheet, web, or matt of directionally or randomly oriented fibers. The porous separator 16 may comprise a microporous polymeric material, e.g., a microporous polyolefin-based membrane or film. For example, the porous separator 16 may comprise a single polyolefin or a combination of polyolefins, such as polyethylene (PE), polypropylene (PP), polyamide (PA), poly(tetrafluoroethylene) (PTFE), polyvinylidene fluoride (PVdF), and/or poly(vinyl chloride) (PVC). In one form, the porous separator 16 may comprise a laminate of one or more polymeric materials, such as a laminate of PE and PP. The porous separator 16 may have a thickness in the range of 20 µm to 30 µm and a porosity in a range of 35% to 50%.

The reference electrode assembly 18 is configured to serve as a reference for monitoring the potential of the positive and negative electrode material layers 20, 24, without interfering with the operation of the electrochemical cell 10, in particular, without inhibiting the free flow of ions between the positive and negative electrode material layers 20, 24. The reference electrode assembly 18 includes a porous polymeric membrane 38, having a first major surface 40 and an opposite second major surface 42, and a porous reference structure 44 disposed on the first major surface 40 of the porous polymeric membrane 38. In the embodiments depicted in FIGS. 1 and 3, the reference electrode assembly 18 is positioned between the negative electrode 14 and the porous separator 16, with the first major surface 40 of the porous polymeric membrane 38 positioned in facing opposition to the second major surface 36 of the porous separator 16 and the porous reference structure 44 disposed along an interface between the first major surface 40 of the porous polymeric membrane 38 and the second major surface 36 of the porous separator 16. In other embodiments, not shown in the drawings, the reference electrode assembly 18 may be positioned between the positive electrode 12 and the porous separator 16, with the first major surface 34 of the porous separator 16 facing toward the reference electrode assembly 18 and the positive electrode 12 and the opposite second major surface 36 of the porous separator 16 facing toward and the negative electrode 14. At the same time, the orientation of the reference electrode assembly 18 may be flipped such that the first major surface 40 of the porous polymeric membrane 38 is positioned in facing opposition to the first major surface 34 of the porous separator 16 and the porous reference structure 44 is disposed along an interface between the first major surface 40 of the porous polymeric membrane 38 and the first major surface 34 of the porous separator 16.

An electrical connector tab 46 may be disposed on the first major surface 40 of the porous polymeric membrane 38 to provide an electrical connection between the porous reference structure 44 and an external lead 48 (FIG. 3) electrically coupled to the controller 28. The electrical connector tab 46 may have a first end and an opposite second end, with the first end of the electrical connector tab 46 being sandwiched between the first major surface 40 of the porous polymeric membrane 38 and the second major surface 36 of the porous separator 16, and the second end of the electrical connector tab 46 extending beyond an outer periphery of the porous polymeric membrane 38 and beyond an outer periphery of the porous separator 16. The first end of the electrical connector tab 46 may be electrically coupled to the porous reference structure 44 and the second end of the electrical connector tab 46 may be electrically coupled to the external lead 48.

In embodiments, the reference electrode assembly 18 optionally may include a porous contact layer 78 disposed on the second major surface 42 of the porous polymeric membrane 38. In the embodiments depicted in FIGS. 1 and 2, the porous contact layer 78 would be disposed along an interface between the second major surface 42 of the porous polymeric membrane 38 and the an opposing surface of the negative electrode material layer 24. Alternatively, in embodiments where the second major surface 42 of the porous polymeric membrane 38 faces toward the positive electrode material layer 20 (not shown), the porous contact layer 78 may be disposed along an interface between the second major surface 42 of the porous polymeric membrane 38 and the an opposing surface of the positive electrode material layer 20.

The porous polymeric membrane 38 serves as a substrate on which the porous reference structure 44 is formed and is configured to help position the porous reference structure 44 within the electrochemical cell 10, without impacting the operation of the cell 10. The porous polymeric membrane 38 exhibits an open microporous structure and may comprise an organic and/or inorganic materials that can physically separate and electrically insulate the porous reference structure 44 from the adjacent positive and/or negative electrode material layers 20, 24 while permitting the free flow of ions therethrough. In practice, the pores of the porous polymeric membrane 38 may be wet and/or infiltrated with an electrolyte to provide the porous polymeric membrane 38 with ion permeability. Like the porous separator 16, the porous polymeric membrane 38 may comprise a microporous polymeric material, e.g., a microporous polyolefin-based membrane or film. The porous polymeric membrane 38 may comprise one or more of the polyolefins discussed above with respect to the porous separator 16, and likewise may be in the form of a single layer or a laminate of one or more polymeric materials. In embodiments, the porous polymeric membrane 38 may include one or more particulate materials, which may be coated on one or both of the surfaces 40, 42, for example, using a binder, or the one or more particulate materials may be embedded throughout the bulk of the porous polymeric membrane 38. When present, the one or more particulate materials may comprise electrically non-conductive ceramic particles, e.g., alumina or silica. The porous polymeric membrane 38 may have a thickness in the range of 10 µm to 20 µm and a porosity of greater than 40% and less than 80%.

The porous reference structure 44 is configured to act as a reference in measuring the individual electrochemical potentials of the positive and negative electrode material layers 20, 24. The porous reference structure 44 includes a porous electrically conductive carbon layer 50 deposited on the first major surface 40 of the porous polymeric membrane 38 and a porous reference electrode layer 52 that at least partially overlaps the electrically conductive carbon layer 50 on the first major surface 40 of the porous polymeric membrane 38. In embodiments, the porous reference structure 44 optionally may include a porous adhesion promoting layer 54 and a porous encapsulation layer 56.

The porous electrically conductive carbon layer 50 is configured to provide an electrically conductive pathway between the reference electrode layer 52 and the electrical connector tab 46, without inhibiting the free flow of ions between the positive and negative electrode material layers 20, 24 of the electrochemical cell 10. The electrically conductive carbon layer 50 may comprise a carbon-based material. The term "carbon-based" refers to materials that include carbon as the single largest constituent of the material. Carbon-based materials may include materials that include, by weight, greater than 50% carbon or less than 50% carbon, so long as carbon is the single largest constituent of the material. In embodiments, the carbon-based material of the carbon layer 50 may comprise, by weight, greater than 60% carbon, preferably greater than 70% carbon, and more preferably greater than 80% carbon. The carbon layer 50 may be deposited on the first major surface 40 of the porous polymeric membrane 38 at a thickness in a range of 10 nanometers to 1 micrometer.

The carbon layer 50 may be deposited on the first major surface 40 of the porous polymeric membrane 38 using any suitable technique that allows for the formation of a thin porous electrically conductive layer of carbon on the porous polymeric membrane 38 that exhibits good adhesion and bonding thereto. Prior to deposition of the carbon layer 50, the major surface 40 of the porous polymeric membrane 38 may be subjected to a plasma treatment process to remove undesirable debris from the surface 40 and to increase the number of reactive groups on the major surface 40 of the porous polymeric membrane 38 available for reacting with and forming new bonds with the carbon-based material of the carbon layer 50. In embodiments, the carbon layer 50 may be deposited on the first major surface 40 of the porous polymeric membrane 38 using an ink jet printing, aerosol printing, screen printing, or low velocity plasma jet printing process. In such case, a carbon-containing precursor solution may be prepared that includes a carbon-based material dispersed in a solvent. The carbon-based material may comprise carbon particles, carbon fibers, carbon nanotubes, and/or graphene. The solvent may comprise an aqueous or nonaqueous solvent having a boiling point of less than about 150° C. The carbon-containing precursor solution is deposited on the surface 40 of the porous polymeric membrane 38, followed by removal of the solvent, for example, by drying the precursor solution in air at room temperature or by heating at a temperature of less than 150° C.

Figure 4:
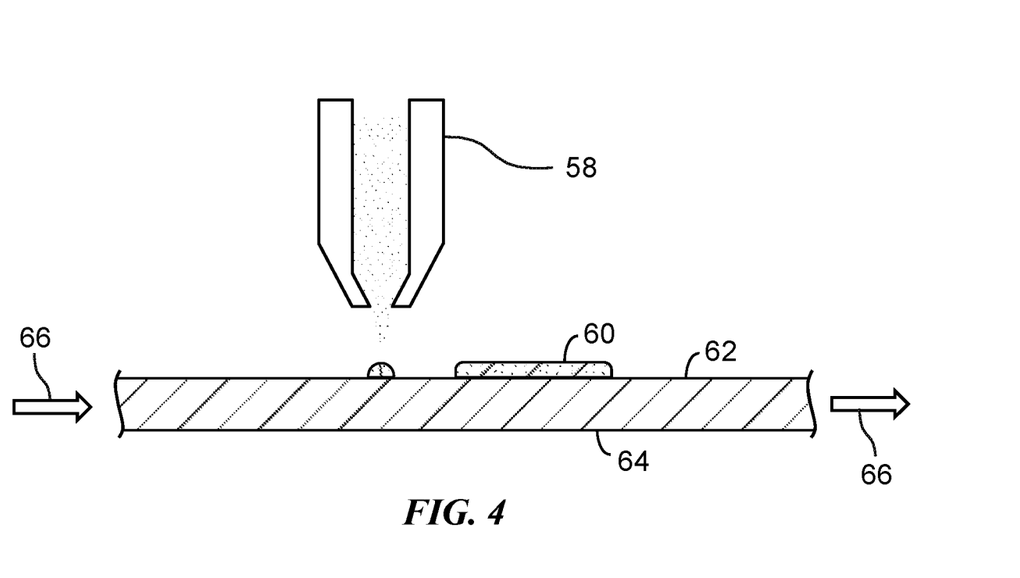
FIG. 4 is a schematic side cross-sectional view of an apparatus for depositing a porous carbon layer on a major surface of a porous polymeric substrate.
Figure 5:
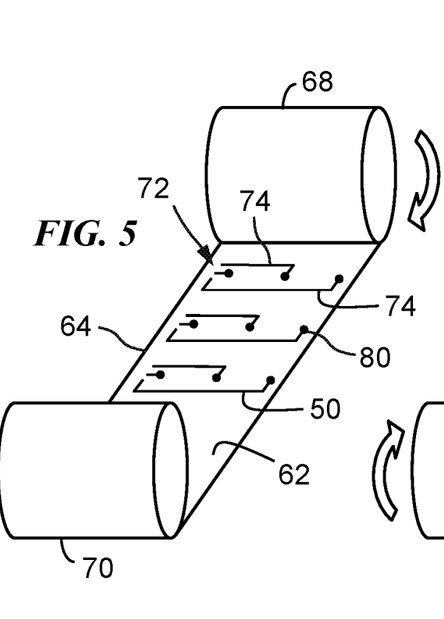
FIG. 5 is a perspective view of an apparatus for forming a porous reference structure on a major surface of a porous polymeric substrate via a continuous roll-to-roll process, wherein the porous reference structure is in the form of a predetermined pattern that includes multiple discrete electrically conductive pathways and multiple discrete reference electrode regions.
Figure 6:
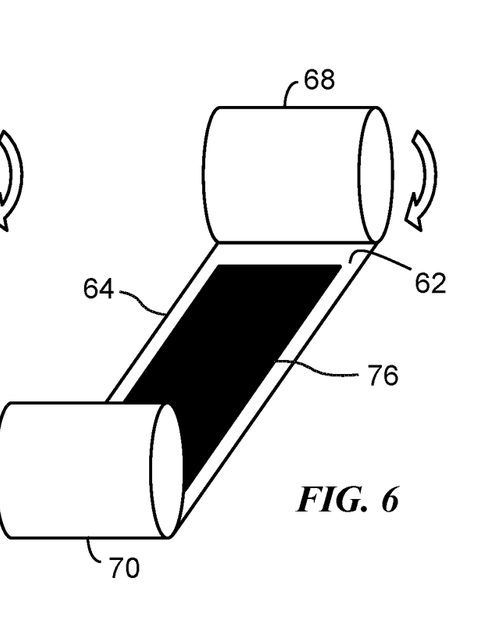
FIG. 6 is a perspective view of an apparatus for forming a porous reference structure on a major surface of a porous polymeric substrate via a continuous roll-to-roll process, wherein the porous reference structure is in the form of a continuous layer.

Referring now to FIGS. 4, 5, and 6, the carbon layer 50 may be deposited on the first major surface 40 of the porous polymeric membrane 38 using a continuous roll-to-roll process, which may help facilitate manufacture of the reference electrode assembly 18 on a large-scale, for example, for industrial applications. In such case, a moveable print head 58 may be used to deposit a layer 60 of a carbon-containing precursor solution on a surface 62 of a continuous sheet 64 of polymeric membrane material as the sheet 64 is being transferred (e.g., in the direction of the arrows 66 in FIG. 4) from a first roll 68 to a second roll 70 (FIGS. 5 and 6). The carbon-containing precursor solution may be dried to remove the solvent from the layer 60 and thereby form a porous electrically conductive carbon layer 50 on the surface 62 of the continuous sheet 64 before the sheet 64 is rolled onto the second roll 70, for example, for storage and/or transportation. As shown in FIGS. 1 and 5, the carbon layer 50 may be deposited on the surface 62 of the continuous sheet 64 (or on the first major surface 40 of the porous polymeric membrane 38) in the form of a predetermined circuit pattern 72 that includes multiple discrete electrically conductive pathways 74. In other embodiments, as shown in FIG. 6, the carbon layer 50 may be deposited on the surface 62 of the continuous sheet 64 (or on the first major surface 40 of the porous polymeric membrane 38) in the form of a continuous layer 76.

The porous reference electrode layer 52 at least partially overlaps the carbon layer 50 on the first major surface 40 of the porous polymeric membrane 38 and is configured to exhibit a known, generally constant electrochemical potential that can be used as a reference in measuring the individual electrochemical potentials of the positive and negative electrode material layers 20, 24. As such, the reference electrode layer 52 preferably comprises an electrochemically active reference electrode material that exhibits a known, generally constant chemical potential (or does not vary much) during operation of the electrochemical cell 10, e.g., during repeated charging and discharging cycles. Also, the reaction kinetics of the electrochemically active reference electrode material of the reference electrode layer 52 may be facile so that the small amount of current flow permitted by the controller 28 to obtain a measurement of the electrochemical potential difference between the reference electrode layer 52 and the positive and/or negative electrode material layers 20, 24 should not cause polarization of the reference electrode layer 52 itself. For example, the electrochemically active reference electrode material of the reference electrode layer 52 may comprise lithium iron phosphate ($LiFePO_4$, LFP), lithium titanium oxide ($Li_4Ti_5O_{12}$, LTO), or lithium nickel manganese cobalt oxide ($LiNiMnCoO_2$, NMC). The reference electrode layer 52 may be deposited on the first major surface 40 of the porous polymeric membrane 38 at a thickness in a range of 200 nanometers to 10 micrometers. In embodiments, the electrochemically active material of the reference electrode layer 52 may be intermingled with a polymeric binder to provide the layer 52 with structural integrity. Examples of polymeric binders include polyvinylidene fluoride (PVdF), ethylene propylene diene monomer (EPDM) rubber, styrene butadiene rubber (SBR), carboxymethyl cellulose (CMC), polyacrylic acid, and mixtures thereof. The reference electrode layer 52 optionally may include particles of an electrically conductive material, which may comprise very fine particles of, for example, high-surface area carbon black.

As shown in FIGS. 1 and 5, in embodiments where the carbon layer 50 is deposited on the surface 62 of the continuous sheet 64 (or on the first major surface 40 of the porous polymeric membrane 38) in the form of a predetermined circuit pattern 72 that includes multiple discrete electrically conductive pathways 74, the reference electrode layer 52 may be deposited on the first major surface 40 of the porous polymeric membrane 38 in the form of multiple discrete reference electrode regions 80, with each of the discrete reference electrode regions 80 being electrically coupled to one of the discrete electrically conductive pathways 74 of the carbon layer 50. The discrete electrically conductive pathways 74 and their associated discrete reference electrode regions 80 may be constructed and arranged so as to provide multiple references for measuring the individual electrochemical potentials of the positive and negative electrode material layers 20, 24. Such an arrangement may be beneficial, for example, in situations where the electrochemical potential of the positive and negative electrode material layers 20, 24 is non-uniform and may differ from one location to another (e.g., along a periphery of the layers 20, 24 as compared to the center).

The reference electrode layer 52 may be deposited on the first major surface 40 of the porous polymeric membrane 38 using a technique that allows for the formation of a thin porous layer that exhibits good adhesion and bonding to the carbon layer 50 and/or the porous polymeric membrane 38. In embodiments, the reference electrode layer 52 may be deposited on the first major surface 40 of the porous polymeric membrane 38 by preparing a slurry containing particles of the electrochemically active material of the reference electrode layer 52. In the slurry, the particles of the electrochemically active material may be dissolved or dispersed in an aqueous or nonaqueous solvent. The slurry also may include the optional polymeric binder and the particles of the electrically conductive material. The slurry may be deposited on the porous polymeric membrane 38, for example, by spraying, screen printing, dip-coating, or drawing the slurry out onto the surface 40 of the porous polymeric membrane 38. Thereafter, the solvent is removed from the slurry, for example, by drying the slurry in air at room temperature, to form the reference electrode layer 52.

The porous adhesion promoting layer 54 may comprise a material that exhibits good adhesion or bonding to the porous polymeric membrane 38 and to the overlying carbon layer 50 and/or reference electrode layer 52. The adhesion promoting layer 54 may comprise a metal, e.g., copper (Cu) and/or nickel (Ni). The term "metal," as used herein, is intended to encompass materials that consist of pure elemental metal, as well as metal alloys that also include one or more metal or non-metal alloying elements. The adhesion promoting layer 54 may be deposited on the surface 40 of the porous polymeric membrane 38, for example, via dry sputtering or electrolytic deposition. The adhesion promoting layer 54 may have a thickness in a range of 2 nanometers to 100 micrometers.

The porous encapsulation layer 56 may be formed over the carbon layer 50 and/or the reference electrode layer 52 on the surface 40 of the porous polymeric membrane 38 to reinforce the structural integrity of the layers 50, 52 and/or to help ensure good bonding of the layers 50, 52 to the porous polymeric membrane 38. The encapsulation layer 56 may comprise a ceramic material, e.g., alumina ($Al_2O_3$), silica ($SiO_2$), zirconia ($ZrO_2$), and/or a dehydrated crystalline aluminosilicate material (a three-dimensional framework of $AlO_4^{-5}$ and $SiO_4^{-4}$ tetrahedra cross-linked by the sharing of oxygen atoms) referred to as a "zeolite." The framework of the dehydrated crystalline aluminosilicate material also may include one or more cations (e.g., lithium, $Li^+$) that balance the negative charge on the $AlO_4^{-5}$ and $SiO_4^{-4}$ tetrahedra. The encapsulation layer 56 may be formed on the surface 40 of the porous polymeric membrane 38 over the carbon layer 50 and/or the reference electrode layer 52 by atomic layer deposition (ALD), chemical vapor deposition (CVD), physical vapor deposition (PVD), and/or dip-coating. The encapsulation layer 56 may have a thickness in a range of 5 nanometers to 100 micrometers.

The porous contact layer 78 disposed on the second major surface 42 of the porous polymeric membrane 38 may be configured to directly engage the facing surface of the negative electrode material layer 24 and to provide an indication of the electrochemical potential at the facing surface of negative electrode material layer 24. The porous contact layer 78 may comprise an electrically conductive metal (e.g., nickel or copper) and may provide an electrically conductive pathway between the facing surface of the negative electrode material layer 24 and an electrical connector tab (not shown) disposed on the second major surface 42 of the porous polymeric membrane 38. As such, the porous contact layer 78 may provide an electrical connection between the facing surface of the negative electrode material layer 24 and an external lead (not shown), which may be electrically coupled to the controller 28. The porous contact layer 78 may be deposited on the surface 42 of the porous polymeric membrane 38, for example, via dry sputtering or electrolytic deposition. The porous contact layer 78 may have a thickness in a range of 10 nanometers to 100 micrometers.

The positive electrode material layer 20 may comprise one or more electrochemically active materials that can undergo a reversible redox reaction with lithium, e.g., a material that can sufficiently undergo lithium intercalation and deintercalation, alloying and dealloying, or plating and stripping. In one form, the positive electrode material layer 20 may comprise an intercalation host material that can undergo the reversible insertion or intercalation of lithium ions. In such case, the intercalation host material of the positive electrode material layer 20 may comprise a layered oxide represented by the formula $LiMeO_2$, an olivine-type oxide represented by the formula $LiMePO_4$, a spinel-type oxide represented by the formula $LiMe_2O_4$, a tavorite represented by one or both of the following formulas $LiMeSO_4F$ or $LiMePO_4F$, or a combination thereof, where Me is a transition metal (e.g., Co, Ni, Mn, Fe, Al, V, or a combination thereof). In another form, the positive electrode material layer 20 may comprise a conversion material including a component that can undergo a reversible electrochemical reaction with lithium, in which the component undergoes a phase change or a change in crystalline structure accompanied by a change in oxidation state. In such case, the conversion material of the positive electrode material layer 20 may comprise sulfur, selenium, tellurium, iodine, a halide (e.g., a fluoride or chloride), sulfide, selenide, telluride, iodide, phosphide, nitride, oxide, oxysulfide, oxyfluoride, sulfur-fluoride, sulfur-oxyfluoride, or a lithium and/or metal compound thereof. Examples of suitable metals for inclusion in the conversion material of the positive electrode material layer 20 include iron, manganese, nickel, copper, and cobalt. In embodiments, the electrochemically active material of the positive electrode material layer 20 may be intermingled with a polymeric binder to provide the positive electrode material layer 20 with structural integrity. Examples of polymeric binders include polyvinylidene fluoride (PVdF), ethylene propylene diene monomer (EPDM) rubber, styrene butadiene rubber (SBR), carboxymethyl cellulose (CMC), polyacrylic acid, and mixtures thereof. The positive electrode material layer 20 optionally may include particles of an electrically conductive material, which may comprise very fine particles of, for example, high-surface area carbon black.

The negative electrode material layer 24 may comprise one or more electrochemically active materials that can undergo the reversible insertion or intercalation of lithium ions at a lower electrochemical potential than the electrochemically active materials of the positive electrode material layer 20 such that an electrochemical potential difference exists between the positive and negative electrode material layers 20, 24. The electrochemically active material of the negative electrode material layer 24 may be generally described as an intercalation host material. Some examples of intercalation host materials for the electrochemically active material of the negative electrode material layer 24 include carbon-based materials (e.g., graphite, activated carbon, carbon black, and graphene), lithium, lithium-based materials, silicon, silicon-based alloys or composite materials, tin oxide, aluminum, indium, zinc, germanium, silicon oxide, titanium oxide, lithium titanate, and combinations thereof. The same polymeric binder materials (PVdF, EPDM, SBR, CMC, polyacrylic acid) and electrically conductive particles (high-surface area carbon black) used in the positive electrode material layer 20 also may be intermingled with the electrochemically active materials of the negative electrode material layer 24 for the same purposes.

The positive and negative electrode current collectors 22, 26 may comprise a material that is capable of collecting and reversibly passing free electrons to and from their respective electrode material layers 20, 24. For example, the negative and/or positive electrode current collectors 22, 26 may comprise an electrically conductive metal, e.g., a transition metal or alloy thereof. In embodiments, the negative electrode current collector 26 may comprise copper, nickel, an iron alloy (e.g., stainless steel), or titanium, and the positive electrode current collector 22 may comprise aluminum, nickel, or an iron alloy (e.g., stainless steel). Other electrically conductive metals may of course be used, if desired.

In assembly, the porous separator 16, the reference electrode assembly 18, the positive electrode material layer 20, and the negative electrode material layer 24 of the electrochemical cell 10 may be infiltrated with an electrolyte (not shown). The electrolyte may comprise a material that is capable of effectively conducting lithium ions through the porous separator 16 and the reference electrode assembly 18, and between the positive electrode material layer 20 and the negative electrode material layer 24. For example, the electrolyte may comprise a non-aqueous liquid electrolyte. In such case, the non-aqueous liquid electrolyte may comprise a solution including a lithium salt dissolved or ionized in a nonaqueous, aprotic organic solvent or a mixture of nonaqueous, aprotic organic solvents. Some suitable lithium salts that may be used to make the electrolyte include $LiClO_4$, $LiAlCl_4$, LiI, LiBr, LiSCN, $LiBF_4$, $LiB(C_6H_5)_4$, $LiAsF_6$, $LiCF_3SO_3$, $LiN(CF_3SO_2)_2$, $LiPF_6$, and combinations thereof. The nonaqueous, aprotic organic solvent in which the lithium salt is dissolved may be a cyclic carbonate (i.e., ethylene carbonate, propylene carbonate), an acyclic carbonate (i.e., dimethyl carbonate, diethyl carbonate, ethyl methyl carbonate), an aliphatic carboxylic ester (i.e., methyl formate, methyl acetate, methyl propionate), a γ-lactone (i.e., γ-butyrolactone, γ-valerolactone), an acyclic ether (i.e., 1,2-dimethoxyethane, 1,2-diethoxyethane, ethoxymethoxyethane), a cyclic ether (i.e., tetrahydrofuran, 2-methyltetrahydrofuran), or a combination thereof. As another example, the non-aqueous electrolyte may comprise a gel or plasticized polymer electrolyte. In such case, the non-aqueous electrolyte may comprise a polymer host material soaked with a non-aqueous liquid electrolyte solution. Some examples of suitable polymer host materials include poly (vinylidene) (PVdF), poly(acrylonitrile) (PAN), poly(methyl methacrylate) (PMMA), poly(ethylene oxide) (PEO), polyacrylates, and poly(vinylidene fluoride-hexafluoropropylene) (PVdF-HFP). The electrolyte also may include one or more additives formulated to improve the performance, life, and safety of the electrochemical cell 10. Some examples of suitable additives for inclusion in the electrolyte include vinylene carbonate, propylene carbonate, and/or lithium bis-oxalatoborate salt.

The controller 28 is electrically connected to (i) the positive electrode material layer 20 via the positive electrode current collector 22 and the external circuit 32, (ii) the negative electrode material layer 24 via the negative electrode current collector 26 and the external circuit 32, and (iii) the reference electrode layer 52 via the carbon layer 50, the electrical connector tab 46, and the external lead 48. The controller 28 may be configured to measure the potential difference between the positive electrode material layer 20 and the negative electrode material layer 24 in real-time to determine the overall electrochemical potential (Ecell) of the electrochemical cell 10 during the charging or discharging of the electrochemical cell 10. The controller 28 may be configured to measure the potential difference between the positive electrode material layer 20 and the reference electrode layer 52 in real-time and, based upon this measurement, to calculate the electrochemical potential (Epos) of the positive electrode material layer 20 during the charging or discharging of the electrochemical cell 10. The controller 28 may be configured to measure the potential difference between the negative electrode material layer 24 and the reference electrode layer 52 in real-time and, based upon this measurement, to calculate the electrochemical potential (Eneg) of the negative electrode material layer 24 during the charging or discharging of the electrochemical cell 10.

The above disclosure enables methods of measuring and controlling the individual electrochemical potentials of the positive and negative electrode material layers 20, 24 and of measuring and controlling the state of charge (SoC) of the electrochemical cell 10 in real-time during charging and discharging of the electrochemical cell 10. In addition, the above disclosure enables methods of minimizing the amount of time required to recharge the electrochemical cell 10, for example, by optimizing and/or maximizing the charge current that can be applied to the electrochemical cell 10 without overcharging the cell 10.

The state of charge (SoC) of an electrochemical cell is the ratio of the actual charge or capacity of the cell expressed as a percentage of the total or maximum amount of charge or capacity that can be stored in the cell. Thus, a SoC of 0% corresponds to the fully discharged state when the negative electrode material layer 24 is fully depleted of lithium, and a SoC of 100% corresponds to the fully charged state when the negative electrode material layer 24 is fully lithiated and the positive electrode material layer 20 is completely depleted of lithium. In some embodiments, depending upon the chemical composition of the positive and negative electrode material layers 20, 24, the overall electrochemical potential of the cell 10 measured by the controller 28 may be used in combination with other stored information in the controller 28 to determine the state of charge (SoC) of the electrochemical cell 10. However, in other embodiments, the overall electrochemical potential of the cell 10 may not provide an accurate indication of the state of charge of the electrochemical cell 10.

Figure 7:
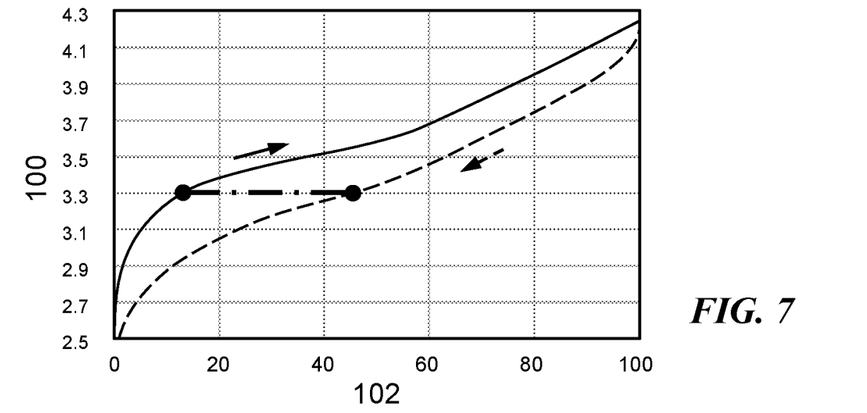
FIG. 7 depicts plots of overall cell voltage (V) vs. state of charge (%) for an electrochemical cell exhibiting hysteresis during charging (solid line) and discharging (dashed line) of the electrochemical cell, the electrochemical cell included nickel-manganese-cobalt oxide (NMC622) as a positive electrode, silicon as a negative electrode, and lithium metal as a reference electrode.
Figure 8:
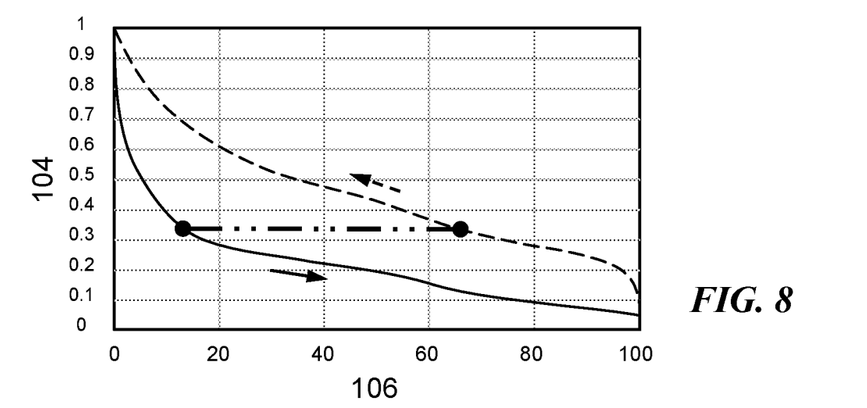
FIG. 8 depicts plots of potential (V) vs. state of lithiation (%) for the silicon negative electrode of the electrochemical cell of FIG. 7 during charging (solid line) and discharging (dashed line) of the electrochemical cell, wherein the potential of the silicon negative electrode was individually measured using the lithium metal reference electrode.
Figure 9:
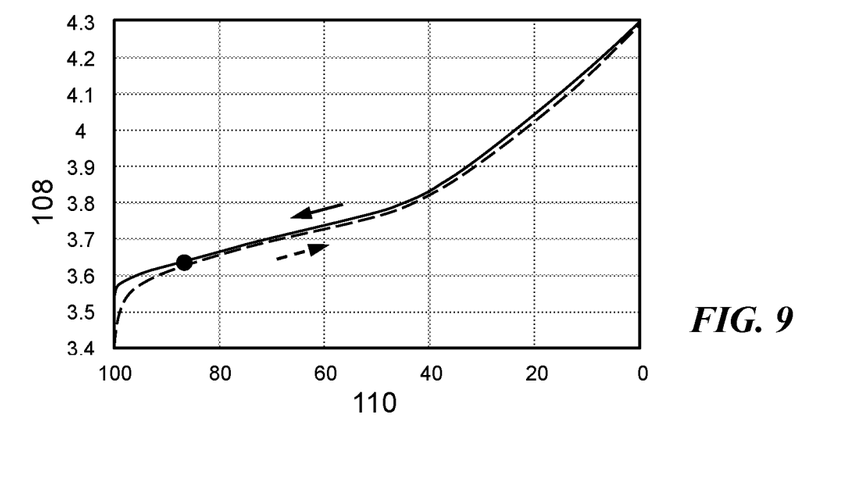
FIG. 9 depicts plots of potential (V) vs. state of lithiation (%) for the NMC622 positive electrode of the electrochemical cell of FIG. 7 during charging (solid line) and discharging (dashed line) of the electrochemical cell, wherein the potential of the positive electrode was individually measured using the lithium metal reference electrode.

Referring now to FIGS. 7-9, in embodiments where the positive or negative electrode material layers 20, 24 exhibit intrinsic hysteresis between charging and discharging, the overall electrochemical potential of the cell 10 may not provide an accurate indication of the state of charge of the electrochemical cell 10. In such case, the presently disclosed reference electrode assembly 18 may be used to separately measure the individual electrochemical potentials of the positive and negative electrode material layers 20, 24 in real-time to provide a more accurate indication of the state of charge of the electrochemical cell 10. By way of example, FIG. 7 depicts plots of overall cell voltage (V) 100 vs. state of charge (%) 102 for an electrochemical cell that exhibits hysteresis during charging (solid line) and discharging (dashed line) of the electrochemical cell. As shown in FIG. 7, due to the hysteresis, depending upon the charging and discharging history of the cell, an overall electrochemical potential measurement (Ecell) of 3.3 V can be indicative of a state of charge anywhere between about 14% and about 46%. Incorporating the presently disclosed reference electrode assembly 18 into the electrochemical cell allows the electrochemical potential of the positive and negative electrode material layers to be measured individually. FIG. 8 depicts plots of electrode potential (V) 104 vs. state of lithiation (%) 106 for the negative electrode material layer individually during charging (solid line) and discharging (dashed line) of the electrochemical cell. As shown in FIG. 8, due to the intrinsic hysteresis of the negative electrode material (e.g., silicon), a measurement of the electrochemical potential (Eneg) of the negative electrode material layer of about 0.34 V can be indicative of a state of lithiation anywhere between about 14% and about 66%. FIG. 9 depicts plots of potential (V) 108 vs. state of lithiation (%) 110 for the positive electrode material layer during charging (solid line) and discharging (dashed line) of the electrochemical cell. As shown in FIG. 9, the positive electrode material (e.g., NMC622) exhibits a very small amount of hysteresis, and thus a measurement of the electrochemical potential (Epos) of the positive electrode material layer of about 3.64 V can be used to accurately determine the state of lithiation of the positive electrode material layer, i.e., about 86%. An accurate determination of the state of lithiation of the positive electrode material layer can then be used to accurately calculate the state of lithiation of the negative electrode material layer, i.e., about 14%.

The maximum charge current that can be applied to the electrochemical cell 10 during recharge without overcharging the cell 10 may be determined based upon a measurement of the individual electrochemical potential of the negative electrode material layer 24 and/or based upon a calculation of the state of charge or state of lithiation of the negative electrode material layer 24. It is desirable to maximize the charge current that can be applied to the electrochemical cell 10 during recharge without overcharging the cell 10 in order to achieve the fastest rate of recharge without potentially plating lithium metal on the surface of the negative electrode material layer 24. Lithium metal plated on the surface of the negative electrode material layer 24 will no longer participate in the electrochemical redox reactions that occur during charging and discharging of the electrochemical cell 10, and thus will reduce the overall capacity of the cell 10.

In practice, the controller 28 may continuously measure the individual electrochemical potential of the positive electrode material layer 20, the negative electrode material layer 24, and/or of the overall electrochemical cell 10. Based upon such measurement(s) and possibly upon additional stored information, the controller 28 may determine the maximum charge current to apply during recharge of the electrochemical cell 10. For example, based upon such measurements, the controller 28 may calculate the state of lithiation or state of charge (SoC) of the negative electrode material layer 24 and may reference a stored state of charge profile to determine the maximum permissible charge current that should be used based upon the actual SoC of the negative electrode material layer 24 calculated in real-time. The controller 28 also may compare the continuously measured individual electrochemical potential of the negative electrode material layer 24 to a threshold potential. When the controller 28 determines that the electrochemical potential of the negative electrode material layer 24 is approaching the threshold potential, the controller 28 may reduce the charge current so that the potential of the negative electrode material layer 24 remains above a potential at which lithium plating may occur. Alternatively, when the controller 28 determines that the electrochemical potential of the negative electrode material layer 24 is approaching or has reached the threshold potential, the controller 28 may stop the charge current entirely.

Accordingly, measuring the individual electrochemical potentials of the positive electrode material layer 20 and/or the negative electrode material layer 24 during charging can allow the charging process to be performed at the fastest charging rate and to be terminated before lithium plating occurs. These and other benefits will be readily appreciated by those of ordinary skill in the art in view of the forgoing disclosure.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. A reference electrode assembly for an electrochemical cell of a secondary lithium ion battery, the assembly comprising:
    a porous membrane having a first major surface and an opposite second major surface, the porous membrane being made of an ionically conductive polymeric material; and
    a porous reference structure disposed on the first major surface of the porous membrane, the porous reference structure including:
        a porous carbon layer deposited on the first major surface of the porous membrane, the porous carbon layer being made of a carbon-based material and being electrically conductive; and
        a porous reference electrode layer deposited on the first major surface of the porous membrane, the porous reference electrode layer including an electrochemically active reference electrode material,
    wherein the porous reference electrode layer at least partially overlaps the porous carbon layer on the first major surface of the porous membrane, and
    wherein the porous reference electrode layer is in physical and electrical contact with the porous carbon layer.

2. The assembly of claim 1 wherein the porous carbon layer has a thickness in a range of 10 nanometers to 1 micrometer.

3. The assembly of claim 1 wherein the carbon-based material of the porous carbon layer comprises at least one of carbon particles, carbon fibers, carbon nanotubes, or graphene, and wherein the carbon-based material of the porous carbon layer comprises, by weight, greater than 60% carbon.

4. The assembly of claim 1 wherein the porous reference electrode layer has a thickness in a range of 200 nanometers to 10 micrometers.

5. The assembly of claim 1 wherein the electrochemically active reference electrode material of the reference electrode layer comprises at least one metal oxide of lithium iron phosphate, lithium titanium oxide, or lithium nickel manganese cobalt oxide.

6. The assembly of claim 1 wherein the ionically conductive polymeric material comprises at least one of polyethylene, polypropylene, polyamide, poly(tetrafluoroethylene), polyvinylidene fluoride, or poly(vinyl chloride).

7. The assembly of claim 1 wherein the porous reference structure further includes:
    a porous adhesion promoting layer deposited directly on the first major surface of the porous membrane, and wherein the porous carbon layer is deposited on the first major surface of the porous membrane over the porous adhesion promoting layer.

8. The assembly of claim 7 wherein the porous adhesion promoting layer includes at least one metal of copper, nickel, silver, or gold, wherein the porous adhesion promoting layer is deposited on the first major surface of the porous membrane in the form of a single monolayer or multiple sequentially deposited monolayers, and wherein the porous adhesion promoting layer has a thickness in a range of 2 nanometers to 100 micrometers.

9. The assembly of claim 1 wherein the porous reference structure further includes:
    a porous encapsulation layer overlying the porous carbon layer and the porous reference electrode layer on the first major surface of the porous membrane.

10. The assembly of claim 9 wherein the porous encapsulation layer has a thickness in a range of 5 nanometers to 100 micrometers, and wherein the porous encapsulation layer comprises at least one ceramic material of $Al_2O_3$, $SiO_2$, $ZrO_2$, or a zeolite.

11. The assembly of claim 1 wherein the porous membrane and the porous reference structure are infiltrated with a nonaqueous liquid electrolyte solution.

12. The assembly of claim 1 further comprising:
    an electrical connector tab having a first end and an opposite second end, the first end of the electrical connector tab being electrically coupled to the porous carbon layer, and the second end of the electrical connector tab extending beyond an outer periphery of the porous membrane, and
    wherein the porous carbon layer provides an electrically conductive pathway for the transfer of electrons between the reference electrode layer and the first end of the electrical connector tab.

13. The assembly of claim 1 wherein the porous carbon layer is deposited on the first major surface of the porous membrane in the form of a predetermined circuit pattern that includes multiple discrete electrically conductive pathways, wherein the porous reference electrode layer is deposited on the first major surface of the porous membrane in the form of multiple discrete reference electrode regions, and wherein each of the discrete electrically conductive pathways is electrically coupled to one of the discrete reference electrode regions of the porous reference electrode layer.

14. An electrochemical cell of a secondary lithium ion battery, the electrochemical cell comprising:
- a positive electrode layer electrically coupled to a positive electrode current collector;
- a negative electrode layer spaced apart from the positive electrode layer and electrically coupled to a negative electrode current collector; and
- a reference electrode assembly disposed between the positive electrode layer and the negative electrode layer, the reference electrode assembly comprising:
    - a first porous membrane having a first major surface;
    - a second porous membrane having a second major surface in facing opposition to the first major surface of the first porous substrate; and
    - a porous reference structure sandwiched between the first major surface of the first porous membrane and the second major surface of the second porous membrane, the porous reference structure including:
        - a porous carbon layer deposited on the first major surface of the first porous membrane, the porous carbon layer being made of a carbon-based material; and
        - a porous reference electrode layer deposited on the first major surface of the first porous membrane, the porous reference electrode layer including an electrochemically active reference electrode material,
        - wherein the porous reference electrode layer at least partially overlaps the porous carbon layer on the first major surface of the first porous membrane.

15. The electrochemical cell of claim 14 wherein the positive electrode layer comprises at least one transition metal oxide that can undergo the reversible intercalation of lithium ions, and wherein the negative electrode layer comprises at least one of graphite or silicon.

16. A method of manufacturing the reference electrode assembly of claim 1, the method comprising:
- depositing a precursor solution on the first major surface of the porous membrane, the precursor solution including particles of a carbon-based material dispersed in a first solvent;
- removing the first solvent from the precursor solution to form a porous carbon layer on the first major surface of the porous membrane;
- depositing a slurry on the first major surface of the porous membrane such that the slurry at least partially overlaps the porous carbon layer, the slurry including particles of an electrochemically active reference electrode material dispersed in a second solvent;
- removing the second solvent from the slurry to form a porous reference electrode layer on the first major surface of the porous membrane.

17. The method of claim 16 wherein the precursor solution is deposited on the first major surface of the porous membrane using an ink jet printing, aerosol printing, screen printing, or low velocity plasma jet printing process.

18. The method of claim 16 further comprising:
- prior to depositing the precursor solution on the first major surface of the porous membrane, subjecting the major surface of the porous polymeric substrate to a plasma treatment.

19. The method of claim 16 further comprising:
- prior to depositing the precursor solution on the first major surface of the porous membrane, forming a porous adhesion promoting layer on the first major surface of the porous membrane,
- wherein the precursor solution is deposited on the first major surface of the porous membrane over the porous adhesion promoting layer, and
- wherein the porous adhesion promoting layer is formed on the first major surface of the porous membrane by dry sputtering or electrolytic deposition.

20. The method of claim 16 further comprising:
- forming a porous encapsulation layer over the porous carbon layer and the porous reference electrode layer on the first major surface of the porous membrane,
- wherein the porous encapsulation layer is formed on the first major surface of the porous membrane by an atomic layer deposition or dip coating process.

* * * * *